(12) United States Patent
Lim et al.

(10) Patent No.: US 10,321,587 B2
(45) Date of Patent: Jun. 11, 2019

(54) INTEGRATED CONNECTOR RECEPTACLE DEVICE

(71) Applicant: Google LLC, Mountain View, CA (US)

(72) Inventors: David Kyungtag Lim, Glenview, IL (US); Jason Edward Jordan, Burlingame, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/424,411

(22) Filed: Feb. 3, 2017

(65) Prior Publication Data

US 2018/0228038 A1  Aug. 9, 2018

(51) Int. Cl.
| | |
|---|---|
| *H01R 13/50* | (2006.01) |
| *H05K 5/00* | (2006.01) |
| *H01R 13/502* | (2006.01) |
| *H04M 1/02* | (2006.01) |
| *H01R 24/64* | (2011.01) |
| *H01R 43/20* | (2006.01) |
| *H01R 12/72* | (2011.01) |
| *H01R 107/00* | (2006.01) |
| *H01R 24/60* | (2011.01) |

(52) U.S. Cl.
CPC ......... *H05K 5/0069* (2013.01); *H01R 12/724* (2013.01); *H01R 13/50* (2013.01); *H01R 13/502* (2013.01); *H01R 24/64* (2013.01); *H01R 43/20* (2013.01); *H04M 1/0274* (2013.01); *H05K 5/003* (2013.01); *H05K 5/0017* (2013.01); *H01R 24/60* (2013.01); *H01R 2107/00* (2013.01)

(58) Field of Classification Search
CPC ....................................... H05K 7/142
USPC ......................................... 361/752
See application file for complete search history.

(56) References Cited

U.S. PATENT DOCUMENTS

| | | |
|---|---|---|
| 5,384,690 A | 1/1995 | David et al. |
| 2006/0050492 A1 | 3/2006 | Goodwin et al. |
| 2010/0062656 A1 | 3/2010 | Lynch et al. |
| 2010/0091451 A1 | 4/2010 | Hendren et al. |
| 2012/0044637 A1 | 2/2012 | Rothkopf et al. |
| 2012/0233361 A1* | 9/2012 | Dalal ............... G06F 13/102 710/32 |
| 2013/0258575 A1 | 10/2013 | Rothkopf et al. |

(Continued)

FOREIGN PATENT DOCUMENTS

CN          105098438          11/2015

OTHER PUBLICATIONS

'www.padpcb.com' [online] "Flexible Printed Curcuit Manufacturing, " 2017 [Retrieved on Feb. 3, 2017] Retrieved from Internet URL<http://www.padpcb.com/flexbile-printed-circuit-manufacturing_p41.html> 4 pages.

(Continued)

*Primary Examiner* — Stanley Tso
(74) *Attorney, Agent, or Firm* — Fish & Richardson P.C.

(57) ABSTRACT

An electronic device is provided. In some embodiments, the electronic device includes an electronic device housing having a sidewall and a connector receptacle integral to the electronic device housing. An electrical connector is fixedly positioned at least partially within the connector receptacle. The electrical connector includes an electrical connector end at least partially within the connector receptacle and a connector body at least partially outside the connector receptacle.

18 Claims, 6 Drawing Sheets

(56) References Cited

U.S. PATENT DOCUMENTS

| | | | | |
|---|---|---|---|---|
| 2013/0332542 | A1* | 12/2013 | Foo | G06F 13/385 709/206 |
| 2014/0069713 | A1* | 3/2014 | Golko | H02G 15/007 174/650 |
| 2014/0170907 | A1 | 6/2014 | Golko et al. | |
| 2014/0184057 | A1 | 7/2014 | Kim et al. | |
| 2015/0089675 | A1* | 3/2015 | Gulick, Jr. | G06F 1/1632 726/35 |
| 2015/0162684 | A1* | 6/2015 | Amini | H01R 12/73 439/660 |
| 2015/0263416 | A1* | 9/2015 | Okano | H01Q 1/36 343/702 |
| 2015/0263777 | A1* | 9/2015 | Fraden | H04B 1/3888 455/575.8 |
| 2016/0079663 | A1 | 3/2016 | Youm et al. | |
| 2017/0040759 | A1 | 2/2017 | Zhang | |
| 2017/0141470 | A1* | 5/2017 | Yong | H01Q 7/06 |
| 2017/0273358 | A1* | 9/2017 | Batista | A24F 47/008 |
| 2017/0293358 | A1* | 10/2017 | Gannon | G06F 3/016 |
| 2017/0358847 | A1* | 12/2017 | Cho | H01Q 1/243 |

OTHER PUBLICATIONS

'www.szsmtfly.com' [online] "Temperature Resist Acf Tapes for Pulse Heat Bonding Machine LCD," 2016-2017 copyright, [retrieved on Feb. 3, 2017] Retrieved from Internet URL<http://www.szsmtfly.com/sale-8234891-temperature-resist-acf-tapes-for-pulse-heat-bonding-machine-lcd.html> 3 pages.

'www.chipworks.com' [online] "Inside the Samasung Galaxy S6," Apr. 2, 2015 [retrieved on Feb. 3, 2017] Retrieved from Internet URL<https://www.chipworks.com/about-chipworks/overview/blog/inside-the-samsung-galaxy-s6> 10 pages.

'www.techinsights.com' [online] "Apple iPhone 7 Teardown," [Retrieved on Feb. 3, 2017} Retrieved from Internet: URLhttp://www.techinsights.com/about-techinsights/overview/blog/apple-iphone-7-teardown/> 24 pages.

'www.fonearena.com' [online] "OnePlus 3 Teardown," [retrieved Feb. 3, 2017] Retrieved from Internet: URL<http://www.fonearena.com/blog/189275/oneplus-3-teardown.html> 14 pages.

'eandt.theiet.org' [online] "Huawei P9 smartphone: tech spec and teardown," Oct. 7, 2016, [retrieved on Feb. 3, 2017] Retrieved from Internet: URL<https://eandt.theiet.org/content/articles/2016/09/huawei-p9-smartphone-tech-spec-and-teardown/> 8 pages.

'www.androidauthority.com' [online] LG g4 Teardown, Jun. 8, 2015, [retrieved on Feb. 3, 2017]. Retrieved from Internet: URL<http://www.androidauthority.com/lg-g4-teardown-614759/> 3 pages.

'www.ifixit.com' [online] "Motorola Moto X Teardown," Aug. 23, 2013, [retrieved on Feb. 2, 2017] Retrieved from Internet URL<https://www.ifixit.com/Teardown/Motorola+Moto+X+Teardown/16867> 15 pages.

'www.ifixit.com' [online] Samsung Galaxy S7 Teardown,' Mar. 8, 2016, [retrieved on Feb. 3, 2017] Retrieved from Internet: URL<https://www.ifixit.com/Teardown/Samsung+Galaxy+S7+Teardown/56686> 17 pages.

'www.ifixit.com' [online] "iPhone 7 Plus Teardown," Sep. 15, 2016, [retrieved on Feb. 3, 2017] Retrieved from Internet: URL<https://www.ifixit.com/Teardown/iPhone+7+Plus+Teardown/67384> 30 pages.

'www.ifixit.com' [online] "Google Pixel XL Teardown," Oct. 21, 2016 [retrieved on Feb. 2, 2017] Retrieved from Internet: URL<https://www.ifixit.com/Teardown/Google+Pixel+XL+Teardown/71237> 14 pages.

International Search Report and Written Opinion, issued in International Application No. PCT/US2017/055767, dated Dec. 20, 2017, 16 pages.

\* cited by examiner

INTEGRATED CONNECTOR RECEPTACLE DEVICE

BACKGROUND

Electronic devices having electrical connectors are widely known. Various electrical connectors transfer data and/or power between electronic devices, such as music players, cellular phones, or other computing devices. Typical connectors have one or more electrical conductors provided within a housing that defines a receptacle. Electronic devices often have openings that allow access to connect an external cable to the electrical conductor and/or housing receptacle within the electronic device.

SUMMARY

In general, this document describes devices, systems, and methods for electrical connection between an electronic device and a component external to the electronic device. Some electronic devices may include a device housing having a connector receptacle at least partially integrated with the housing. The connector receptacle may include a conduit extending into the interior of the housing that is sized to receive a complementary connecting end of a data and/or power cable. Some connector receptacles may reduce the volume required to accommodate the connector and associated components. The size of the electronic device may accordingly be reduced, or other components may be accommodated within the electronic device.

As additional description to the embodiments described below, the present disclosure describes the following embodiments.

Embodiment 1 is an electronic device, comprising: an electronic device housing having a sidewall; a connector receptacle integral to the electronic device housing; and an electrical connector positioned at least partially within the connector receptacle, the electrical connector including an electrical connector end at least partially within the connector receptacle and a connector body at least partially outside the connector receptacle.

Embodiment 2 is the electronic device of embodiment 1, wherein the connector receptacle is integral to the sidewall.

Embodiment 3 is the electronic device of embodiment 2, wherein the connector receptacle includes walls extending between a first opening through an outer surface of the sidewall and a second opening within the electronic device housing.

Embodiment 4 is the electronic device of embodiment 3, wherein the connector receptacle has a length (l) between the first and second openings, and the length (l) is greater than a thickness (t) of the sidewall.

Embodiment 5 is the electronic device of embodiment 4, wherein the connector receptacle has a width (w) between opposite walls of the connector receptacle, and the length (l) is greater than the width (w).

Embodiment 6 is the electronic device of any of the preceding embodiments, wherein the electrical connector is a USB-C type connector.

Embodiment 7 is the electronic device of any of the preceding embodiments, wherein the sidewall is a bottom sidewall of the electronic device housing that opposes a top sidewall of the electronic device housing, the top sidewall of the electronic device housing being located closer to a camera of the electronic device than the bottom sidewall of the electronic device.

Embodiment 8 is the electronic device of any of the preceding embodiments, further comprising: a first circuit board positioned at a top of the electronic device housing; and a second circuit board positioned at a bottom of the electronic device housing, the connector body directly connected to the second circuit board.

Embodiment 9 is the electronic device of embodiment 8, wherein a microphone and a vibrator are mounted to the second circuit board.

Embodiment 10 is the electronic device of any of the preceding embodiments, wherein the connector receptacle is integral with a shoulder of the electronic device housing.

Embodiment 11 is the electronic device of embodiment 10, further comprising a display assembly engaged with the shoulder.

Embodiment 12 is the electronic device of embodiment 11, wherein the shoulder has a width ($w_{shoulder}$) and the connector receptacle has a length (l), and the length (l) is greater than the width ($w_{shoulder}$).

Embodiment 13 is the electronic device of any of the preceding embodiments, wherein the electrical connector end is a male electrical connector end.

Embodiment 14 is the electronic device of any of the preceding embodiments, further comprising a post integral to the electronic device housing, the connector receptacle positioned between the sidewall and the post.

Embodiment 15 is an electronic device, comprising: an electronic device housing having a sidewall; a first circuit board positioned at a top of the electronic device housing; a second circuit board positioned at a bottom of the electronic device housing; a connector receptacle integral the sidewall of the electronic device housing, the connector receptacle having walls extending between a first opening through an outer surface of the sidewall and a second opening within the electronic device housing; and an electrical connector fixedly positioned at least partially within the connector receptacle, the electrical connector including a male electrical connector end at least partially within the connector receptacle and a connector body at least partially outside the connector receptacle directly connected to the second circuit board.

Embodiment 16 is the electronic device of embodiment 15, wherein the connector receptacle has a length (l) between the first and second openings, and the length (l) is greater than a thickness (t) of the sidewall.

Embodiment 17 is the electronic device of embodiment 15 or 16, wherein the connector receptacle has a width (w) between opposite walls of the connector receptacle, and the length (l) is greater than the width (w).

Embodiment 18 is a method of manufacturing an electronic device, comprising: forming a connector receptacle integral to an electronic device housing of an electronic device; positioning a connector end of an electrical connector within the connector receptacle; and securing the electrical connector in a fixed positioned relative to the electronic device housing.

Embodiment 19 is the method of embodiment 18, wherein the step of positioning the connector end comprises frictionally engaging a connector body of the electrical connector with walls of the connector receptacle.

Embodiment 20 is the method of embodiment 18 or 19, wherein the connector end comprises a male connector end.

These and other embodiments described herein may provide one or more of the following benefits. First, some configurations described herein allow an electronic device to be smaller. A connector receptacle integral with the electronic device housing reduces space associated with an additional housing defining the connector receptacle.

Second, a connector receptacle integral with the electronic device can free space to accommodate other components. Accordingly, additional or larger components can be housed within the electronic device without requiring the overall size of the electronic device to be increased.

Third, a connector receptacle integral with the electronic device can facilitate a robust connector that can be used through thousands of cycles without failure. In some embodiments, the electronic device includes a rigid housing (e.g., metal, plastic, glass) that is constructed such that insertion and removal forces associated with plugging and unplugging a connector with the electronic device are at least partially absorbed by the housing itself. A robust electrical connection may thus be provided, and the likelihood that a component would be separated or otherwise damaged during use is reduced.

Fourth, a connector receptacle integral with the electronic device can facilitate efficient and reliable manufacturing processes. For example, some configurations described herein reduce the number of components that must be assembled in manufacturing the electronic device by eliminating an additional connector housing (e.g., that defines the connector receptacle) accommodated within an outer housing of the electronic device. Accordingly, the assembly steps and cost associated with an additional connector housing may be eliminated.

Fifth, a connector receptacle integral with the electronic device can provide an aesthetically pleasing appearance of the connector receptacle and the overall electronic device (e.g., having clean lines or fewer seemingly extraneous components or features).

The details of one or more embodiments are set forth in the accompanying drawings and the description below. Other features and advantages will be apparent from the description and drawings, and from the claims.

DESCRIPTION OF THE DRAWINGS

The details of one or more embodiments are set forth in the accompanying drawings and the description below, and wherein.

DETAILED DESCRIPTION OF ILLUSTRATIVE EMBODIMENTS

Figure 1:
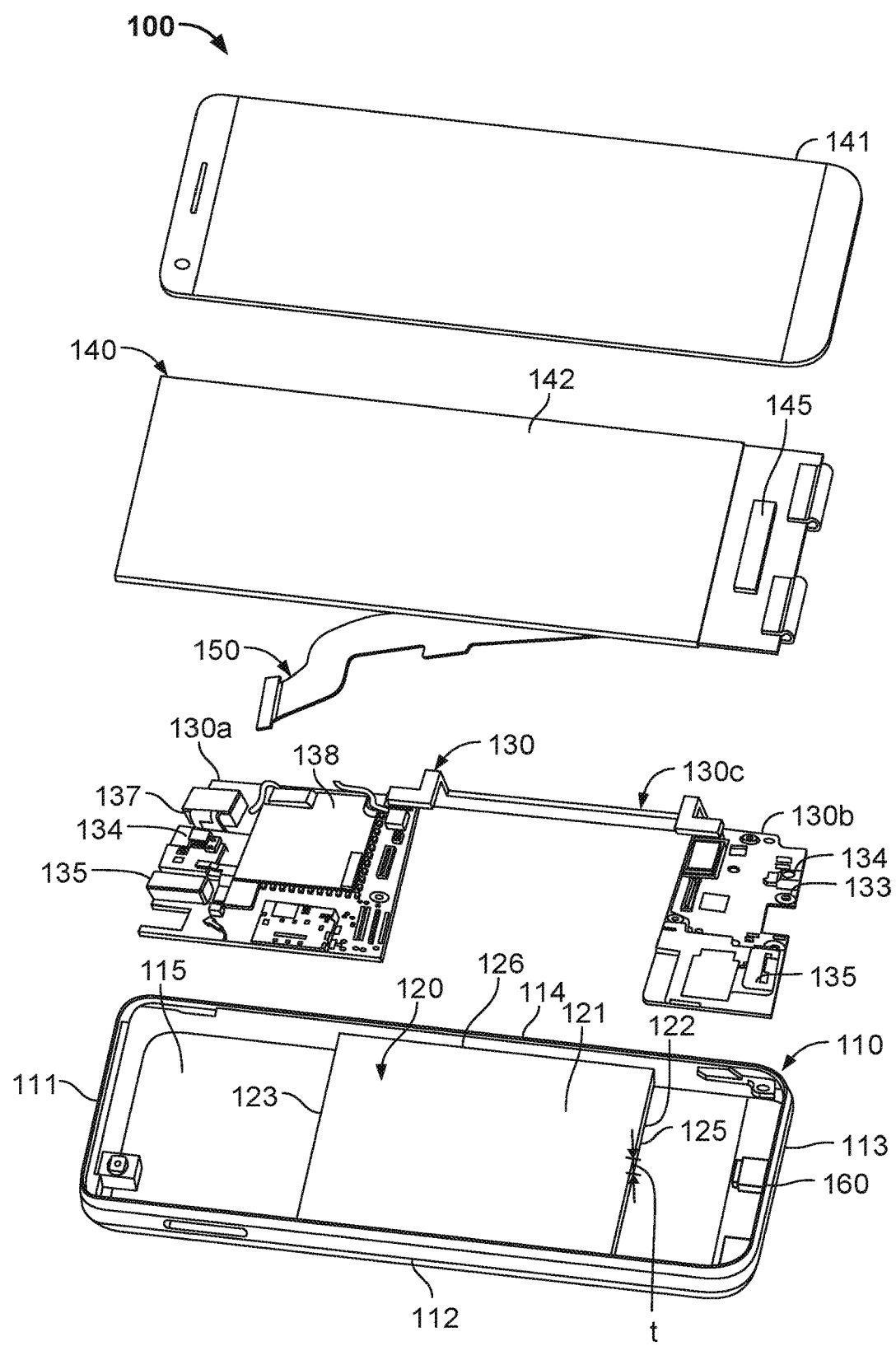
FIG. 1 is a perspective view of an electronic device having an integral connector receptacle.
Figure 2:
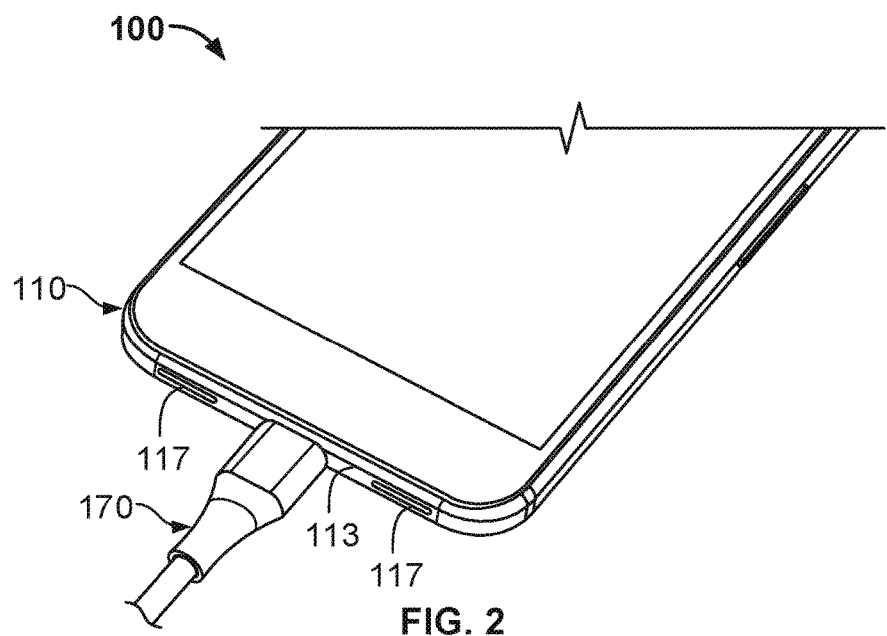
FIG. 2 is a partial perspective view of the electronic device of FIG. 1 having a cord connected to a connector receptacle.
Figure 3:
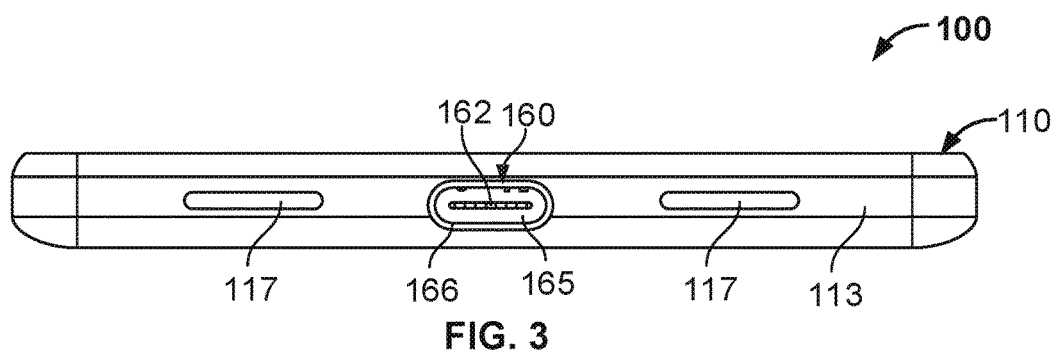
FIG. 3 is a bottom view of the electronic device of FIG. 1.

Referring to FIGS. 1-3, an example electronic device 100 is shown, including an electronic device housing 110, battery 120, circuit board 131, and a display assembly 140 (FIG. 2). Electronic device 100 has a connector 160 shaped to receive a complementary connector end of a cable 170 (FIG. 2) to connect electronic device 100 to an external component for data and/or power transfer. Connector 160 is configured to have a small profile, reducing the thickness of electronic device 100 required to accommodate connector 160, and freeing space within electronic device 100 to house other components.

Electronic device 100 may be an electronic device, such as a mobile phone, music player, tablet, laptop computing device, wearable electronic device, data storage device, display device, adapter device, desktop computer, portable battery pack, electronic adapter, docking station, or other electronic device.

Electronic device housing 110 may be a bucket-type enclosure having first, second, third, and fourth side portions 111, 112, 113, 114 that define outer sidewalls of electronic device 100, and a major planar face 115 integral with side portions 111, 112, 113, 114. A bucket-type enclosure allows components of electronic device 100 to be accommodated within housing 110 and enclosed by an outer cover, such as outer cover 141. In other embodiments, one or more side portions 111, 112, 113, 114, and/or back major planar face 115 may be formed separately and subsequently joined together (e.g., with one or more adhesives, welds, snap-fit connectors, fasteners, etc.) to form electronic device housing 110. In various exemplary embodiments, electronic device housing may be an H-beam type housing or other electronic device housing 110 that includes one or more walls that provide a housing to at last partially support and/or enclose components of electronic device 100.

Electronic device housing 110 may be fabricated from a material that provides adequate structural rigidity to support and protect internal components of electronic device 100. In some embodiments, electronic device housing 110 is formed from a single piece of metal. Electronic device housing 110 may be milled, molded, forged, etched, printed, or otherwise formed. Alternatively or additionally, electronic device housing 110 may be formed from plastic, glass, wood, carbon fiber, ceramic, combinations thereof, and/or other materials.

Electronic device housing 110 and an outer cover 141 define an interior volume that can house various components of electronic device 110, including battery 120, circuit board 130, and display assembly 140. Electronic device housing 110 can accommodate additional components of electronic device 100, such as microphone 133, speaker 134, sensors 135, such as fingerprint sensors, proximity sensors, accelerometers, and/or other sensors, camera assembly 136, flash devices 137, processor 138, antennas, and/or other components. In various embodiments, some or all of these components may be electrically connected with circuit board 130.

In some embodiments, electronic device 100 includes a display assembly 140 that provides a user interface display that displays information to a user. For example, display assembly 140 may provide a touch screen display that a user can interact with to view displayed information and to provide input to electronic device 100. In some embodiments, display assembly 140 occupies substantially all or the majority of a front major face 116 of electronic device 100 (e.g., and covers battery 120 and first, second, and third circuit boards 130a, 130b, 130c), and includes a rectangular visible display.

Display assembly 140 includes one or more substrate layers that provide the visible display and/or allow display assembly 140 to receive touch input from a user. For example, outer cover 141 may serve as an outermost layer that encloses other components of display assembly 140 and electronic device 100 and that a user may physically touch to provide input to electronic device 100. In some embodiments, display assembly 140 includes a liquid crystal display (LCD) panel 142 including a liquid crystal material positioned between one or more color filter and thin-film-transistor (TFT) layers. The layers of display panel 142 may include substrates formed from glass or polymer, such as polyamide. In various embodiments, display assembly 140 may be a light-emitting diode (LED) display, an organic light-emitting diode (OLED) display, such as an active-matrix organic light-emitting diode (AMOLED) display, a plasma display, an electronic ink display, or other display that provides visual output to a user.

Display assembly 140 includes driver circuitry used to control display output and/or receive user input. In some embodiments, driver circuitry includes a display integrated circuit 145 that is mounted in electrical communication with the TFT layers of display panel 142, for example by gate lines or other electrical connection. Display integrated circuit 145 may receive display data from processor 138, for example, and deliver corresponding signals to control the optical properties of a liquid crystal layer, for example, to produce a visible output.

Connection between display integrated circuit 145 and circuit board 130 (and processor 138, for example) may be provided by an electrical conductor that facilitates a robust electrical connection while maintaining a low profile configuration that does not significantly increase the overall dimensions of electronic device 100. In some embodiments, a flex conductor 150 connects display integrated circuit 145 and circuit board 130. Flex conductor 150 includes conductive structures on a thin, flexible substrate. Flex conductor 150 has a relatively thin profile and may be bent along a longitudinal direction to fit between various components of electronic device 100, such as to connect from a front face of a display substrate to circuit board 130 by passing between battery 120 and a rear of display assembly 140. Flex conductor 150 may be connected between first circuit board 130a (e.g., a top circuit board) or second circuit board 130b (e.g., a bottom circuit board). Alternatively or additionally, further electrical communication between display assembly 140 and the other of first circuit board 130a or second circuit board 130b may be provided via third circuit board 130c (e.g. a printed circuit board, flex conductor, etc., extending between first and second circuit boards 130a, 130b), for example.

Conductive structures of flex conductor 150 may include conductive lines, printed conductive traces, or other conductive components that provide electrical connection between respective electrical contacts associated with display integrated circuit 145 and circuit board 130. Flex conductor 150 may be a single, double, or multi-layer flexible printed circuit including a polyamide, PEEK, polyester, having printed or laminated conductive elements, for example. Such construction provides robust electrical characteristics that can provide reliable connection between various components while having a low bending radius to facilitate compact arrangement of flex conductor 150 within electronic device 100.

Battery 120 is positioned within electronic device housing 110. In some embodiments, battery 120 is positioned substantially centrally and/or towards a bottom region of electronic device housing 110 that may promote a user's perception of stability when electronic device 100 is handled. For example, battery 120 may be positioned adjacent to first, second, and/or third circuit boards 130a, 130b, 130c such that battery 120 is positioned substantially centrally between top and bottom sidewalls 111, 113. In various other embodiments, battery 120 may be positioned in a stacked configuration such that circuit boards 130a and/or 130b are between battery 120 and display assembly 140 (e.g., sandwiched between battery 120 and display assembly 140), or vice versa.

Battery 120 provides a primary source of power for electronic device 100 and its components. Battery 120 may include a secondary cell, rechargeable battery configured for use through thousands of battery charging cycles over the entire useful life of electronic device 100, for example. In various embodiments, battery 120 may be a lithium polymer battery, lithium ion battery, nickel metal hydride battery, nickel cadmium battery, or other battery type configured to power electronic device 100 over many charging cycles. Alternatively or additionally, battery 120 may include a primary cell battery configured to be replaced when substantially discharged.

Battery 120 is shaped to provide a desired power capacity in a space-efficient configuration. In some embodiments, battery 120 has front and back major planar faces 121, 122 separated by minor sides 123, 124, 125, 126 defining a thickness ($t_{thickness}$) of battery 120. For example, sides 123, 125, may be parallel with top and bottom sidewalls 111, 113 of electronic device housing 110, and extend substantially across a width of electronic device housing 110, such as more than 50%, more than 75%, or more than 90% of the width of electronic device housing. Such a configuration promotes a relatively high power capacity for a battery having a particular power density.

Circuit board 130 is configured to accommodate components of electronic device 100 in a space-efficient manner, and provide robust mechanical and electrical connections between these components. Circuit board 130 may support and/or electrically connect one or more components of electronic device 100 such as one or more of battery 120, microphone 133, speaker 134, sensors 135, camera assembly 136, flash devices 137, processor 138, electrical connectors (e.g., USB connectors, audio connectors, etc.), antenna lines, and/or other components. In some embodiments, circuit board 130 includes first circuit board 130a positioned at a top region of electronic device housing 110, second circuit board 130b positioned at a bottom region of electronic device housing 110. Third circuit board 130c connects the first and second circuit boards 130a, 130b. First, second, and third, circuit boards 130a, 130b may be separately formed circuit boards and may be electrically connected by an electrical conductor. In other embodiments, first and second circuit boards 130a, 130b are integrally formed as a unitary circuit board with third circuit board 130c extending between first and second circuit boards 130a, 130b.

First and second circuit boards 130a, 130b may be positioned at top and bottom positions of electronic device housing 110 so that various components may be accommodated at top and bottom regions of the electronic device. For example, first circuit board 130a is positioned at a top region of electronic device housing 110 and may include components beneficially positioned at the top region. First circuit board 130a may accommodate components such as an earpiece assembly including a speaker, front facing camera, proximity sensor, antenna lines, a microphone configured to receive audio from the external environment that may be processed to provide noise cancellation, camera flash, diversity antenna, and/or other components. Second circuit board 130 is positioned at a bottom region of electronic device housing 110 and may include components beneficially positioned at the bottom region. Second circuit board may accommodate components such as an electrical connector (e.g., USB connectors, audio connectors, etc.), audio speaker, microphone to receive audio input from a user or the external environment, vibrator, and/or other components. Such positioning may promote functionality and usability of the components by a user of electronic device 100.

Connector 160 includes a connector receptacle 161 having a size and shape configured to receive a complementary connector of a data and/or power cable 170. In some embodiments, connector 160 includes a male electrical connector end 162 extending outwards (e.g., from an innermost portion of connector receptacle 161) towards an opening of connector receptacle 161. A compatible cable 170 may include a female connector positionable at least partially in contact with male electrical connector end 162 within connector receptacle 161. Frictional engagement between cable 170 and connector receptacle 161 and/or male electrical connector end 162 maintains engagement between connector 160 and cable 170. A user can electrically connect cable 170 with electronic device 100 by inserting the connecting end into connector receptacle 161. Cable 170 is maintained in electrical connection with connector 160 until removal by the user.

One or more retention features may be included to facilitate a robust connection and reduce the likelihood of cable 170 inadvertently disengaging from connector 160. Retention features may include one or more ribs, tabs, grooves, springs, clips, other retention features, and/or combinations thereof. Optionally, one or more retention features may provide feedback to the user that a proper connection has been achieved. Interaction between features of connector 160 and cable 170 may provide an audible or tactile feedback to a user that a successful connection has been achieved.

Electronic device 100 may include one or more connectors 160 at various locations on electronic device housing 110. For example, connector 160 is positioned centrally on bottom sidewall 113 (e.g., a sidewall parallel with, and closest to, a bottom edge of user interface display 140). Alternatively or additionally, connector 160 may be positioned on sidewalls 111, 112, 114, and/or on back planar major planar face 115. In various embodiments, connector 160 may be a USB connector, such as a USB-B, USB-C, or micro-USB connector, HDMI connector, optical connector, audio connector, power connector, digital video connector, or other connector type.

Electronic device housing 110 may include one or more other ports for other connectors, one or more user inputs, such as buttons or switches, and/or openings for speakers. In the embodiment shown in FIG. 3, bottom sidewall 113 of electronic device housing 110 includes first and second ports 117 on each side of connector 160. Ports 117 include openings defined through a thickness of bottom sidewall 113 of electronic device housing 110. Alternatively or additionally, back major planar face 115 may include one or more buttons that allow user input to electronic device 100. Housing 110 includes an opening to accommodate the button, and may include one or more features to facilitate attachment and actuation of the button.

Figure 4:
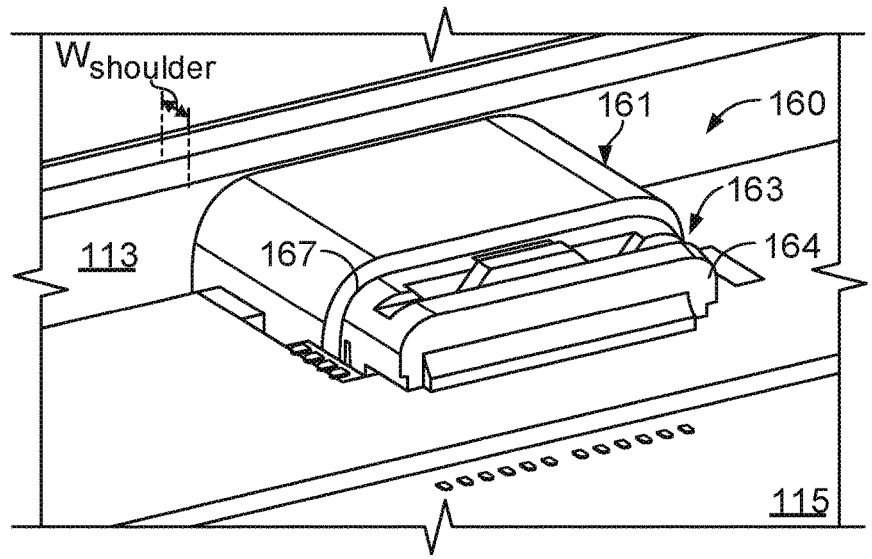
FIG. 4 is a perspective view of a connector receptacle of the electronic device of FIG. 1.
Figure 5:
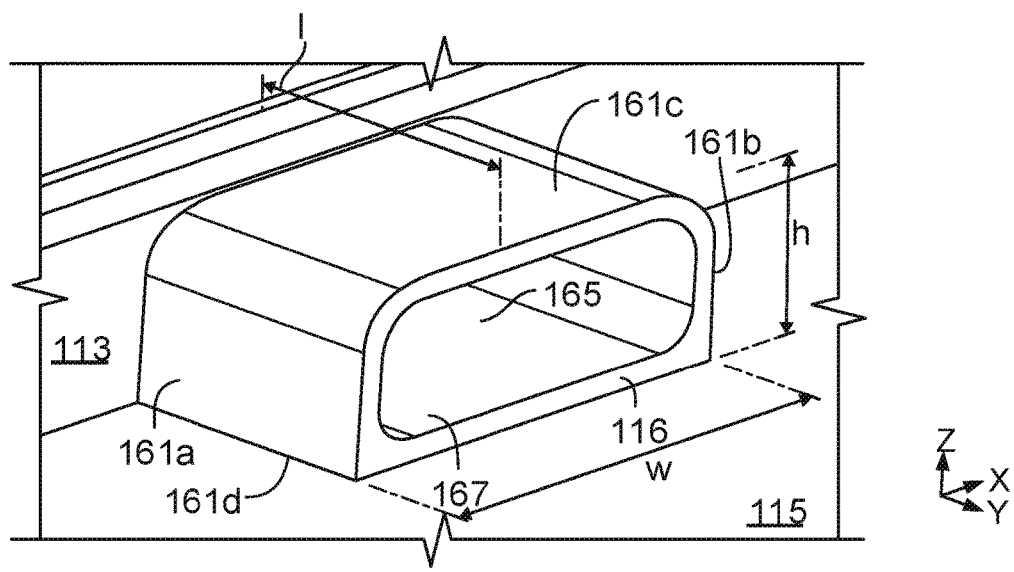
FIG. 5 is a perspective view of a connector receptacle housing an electrical connector.
Figure 6:
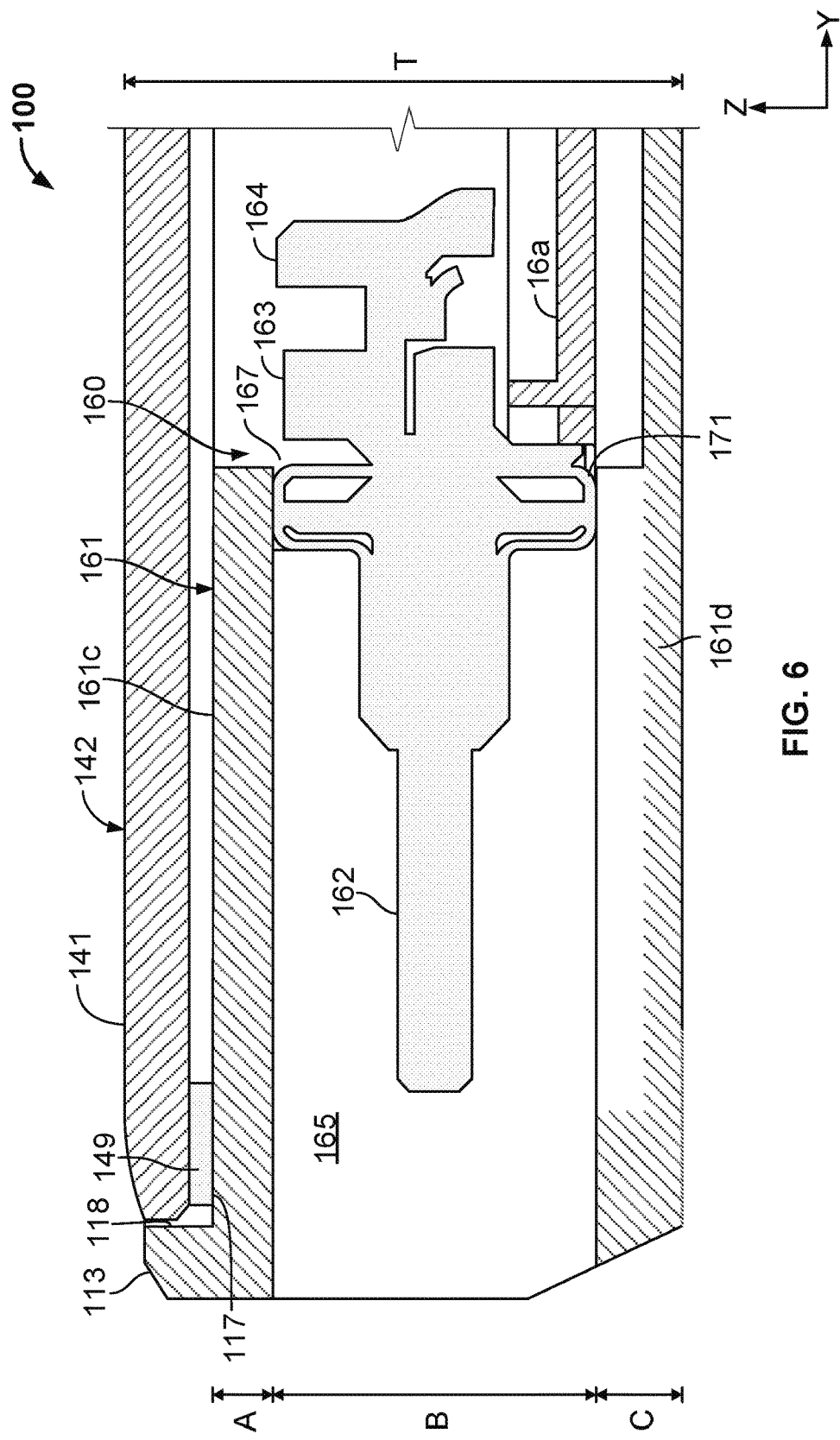
FIG. 6 is a cross-section view of the connector receptacle housing and electrical connector of FIG. 5.

Referring to FIGS. 4-6, an example connector 160 includes connector receptacle 161 and circuit board assembly 163 positioned partially within connector receptacle 161. Circuit board assembly 163 includes electrical connector end 162, connector body 164, and circuit board 169. Electrical connector end 162 is at least partially accommodated within a space 165 defined by connector receptacle 161, and is configured to electrically connect with a complementary connector of an external component or cable, such as cable 170. In some embodiments, circuit board assembly 163 may be an integral part of circuit board 130b (e.g., such that circuit board 169 is an integral part of circuit board 130b). In other embodiments, circuit board 130b is separately formed and may be subsequently electrically connected to first and/or second circuit board 130a, 130b.

Connector receptacle 161 is integral to (e.g. integrally formed with) electronic device housing 110. Connector receptacle 161 extends inwardly from a wall portion of housing 110, such as wall portion 113. Connector receptacle 161 includes a first opening 166 (FIG. 2) defined through an outer surface of wall portion 113, for example, of electronic device housing 110, and a second opening 167 located at an interior of electronic device housing 110. In some embodiments, first and second openings are spaced from each other and/or positioned at opposite ends of connector receptacle 161, such that space 165 is defined by walls of connector receptacle 161 between first and second openings 166, 167. In various embodiments, connector receptacle 161 may be positioned proximate one or more other portions of electronic device housing 110 and extend inwardly from wall portion 111, 112, 114, and/or back major planar face 115, for example.

First and second openings 166, 167 may be sized to accommodate a complementary electrical connector (e.g., such as an electrical connector of cable 170) and/or to facilitate manufacturing and assembly of connector 160. In some embodiments, first and second openings are identical in shape and in size. For example, connector receptacle 161 may have a substantially oval cross-section that has a substantially consistent cross-sectional area between first and second openings 166, 167. In various other embodiments, first and second openings may differ in size and/or shape, and first opening 166 may be larger than second opening 167, or second opening 167 may be larger than first opening 166. Connector receptacle 161 may define an interior space 165 having a square, rectangular, circular, elliptical, non-symmetrical, combinations thereof, or other cross-sectional shape.

The dimensions of connector receptacle 161 may be selected to accommodate components of circuit board assembly 163, such as electrical connector end 162, and complementary features of an external component, such as cable 170. Connector receptacle 161 has a length (l) between first opening 166 and the rear end of connector receptacle 161, such as second opening 167, a width (w) between side walls 161a, 161b, and a height (h) between top and bottom walls 161c, 161d. In some embodiments, length (l) is greater than width (w) and/or height (h). For example, connector receptacle 161 extends a greater distance inwardly from side portion 113 than a distance along sidewall 113. A length (l) that is greater than a width (w) and height (h) may facilitate a compact connector that reduces the volume connector 160 occupies in electronic device 100, particular along the x-direction (e.g., along a width of electronic device 100 between side portions 111, 112) and the z-direction (e.g., along a thickness of electronic device 100 between back major planar face 115 and a front of electronic device 100) of electronic device 100. Alternatively or additionally, length (l), width (w), and/or height (h) may be greater than a wall thickness of electronic housing 110 (e.g., greater than a wall thickness of first, second, third, or fourth sidewalls 111, 112, 113, 114). In some embodiments, length (l) may be between 2 and 15, 3 and 10, or about 5 times or more the wall thickness of housing 110.

In some embodiments, length (l) of connector receptacle 161 is greater than a device thickness of electronic device 100, such as a thickness of side portion 113 between back major planar face 115 and a front edge of side portion 113 (e.g., where a cover joins side portion 113). Such a configuration can accommodate a circuit board assembly 163 and electrical connector end 162 that is relatively long, while maintaining a slim profile that reduces the overall thickness required of electronic device 100. Such dimensions may also promote a stable engagement between connector receptacle 161 and a complementary portion of a cable received by connector receptacle 161.

In various embodiments, length (l) of connector receptacle 161 is between 5 mm and 20 mm, 7 mm and 15 mm, or about 10 mm, width (w) is between 3 mm and 17 mm, 6 mm and 12 mm, or about 8.5 mm, and height (h) is between 1 mm and 8 mm, 2 mm and 5 mm, or about 3.0 mm. Connector receptacle 161 may extend perpendicularly from side portion 113, such that length (l) is parallel to side portions 111, 112, and perpendicular to side portions 113, 114.

In some embodiments, connector receptacle 161 is integrally formed with electronic device housing 110 along the entire length (l). Alternatively or additionally, connector receptacle 161 is integrally formed with electronic device housing 110 along the entire width (w), and/or height (h).

Connector receptacle 161 may be configured to facilitate manufacturing and assembly so that components associated with connector 160 may be accommodated in an efficient manner. For example, bottom wall 161d may be integrally formed with back major planar face 115 of electronic device 110 such that the bottom wall 161d is entirely joined with back major planar face 115. Alternatively or additionally, electronic device housing 110 may have a wall thickness that is greater at the location of bottom wall 161d as compared to a location adjacent to bottom wall 161d. In other embodiments, bottom wall 161d may be separated from back major planar face 115 by a space or another component. A step 116 may be defined proximate second opening 167 between the interior of bottom wall 161d and the inner surface of back major planar face 115 of housing 110. Step 116 allows one or more components to be positioned substantially even with bottom wall 161d along back major planar face 115, such as a circuit board or other portion of circuit board assembly 163.

Connector receptacle 161 may include one or more openings along the length of connector receptacle 161 that allows electrical and/or mechanical connection between a component within connector receptacle 161 and a circuit board or other component within electronic device housing 110 outside of connector receptacle 161. For example, electrical connection between electrical connector end 162 may be partially or completely achieved through openings 168 through side walls 161a, 161b. Such a connection may facilitate a robust connection in which force exerted during insertion or removal of a complementary connector is at least partially absorbed by electronic device housing 110, while the force exerted on the electrical connections is reduced. In some embodiments, the rear of connector receptacle 161 is completely closed by a rear wall integrally formed with the other portions of connector receptacle 161, and openings 168 may be the only openings through connector receptacle 161 into the interior of electronic device housing 110. Connector receptacle 161 may include openings 168 along its length in addition to opening 167 or as an alternative to opening 167.

Referring to FIG. 6, a cross-sectional view of electrical connector 160 is shown. Circuit board assembly 163 is retained at least partially within connector receptacle 161 such that electrical connector end 162 extends longitudinally within connector receptacle 161 (e.g., at least partially between first and second openings 167, 168. In some embodiments, electrical connector end 162 is substantially centrally located within space 165 defined by connector receptacle 161. For example, electrical connector end 162 may provide a male electrical connector that can be received by a complementary female connector positioned in space 165 surrounding electrical connector end 162. When a complementary connector is not engaged with connector 160, there may be no intervening components between male electrical connector end 162 and connector receptacle 161 integrally formed with electronic device housing 110. For example, male electrical connector end 162 may be separated from connector receptacle 161 integrally formed with electronic device housing 110 by only space 165. Alternatively or additionally, electrical connector end 162 may include a female electrical connector positioned on or adjacent to one or more walls of connector receptacle 161 such that a complementary male electrical connector may be inserted into the connector receptacle 161 to electrically connect with electrical connector end 162.

Connector receptacle 161 may be integrally formed with one or more other features of electronic device housing 110. In some embodiments, connector receptacle 161 is integrally formed with a feature of electronic device housing 110 configured to receive a display assembly. For example, electronic device housing 110 may include a ledge or shoulder 117 that display assembly 140 engages with. Display assembly 140 may be sealingly joined with electronic device housing 110 at shoulder 117 to enclose components within electronic device housing 110 and to prevent ingress of foreign environmental contaminants such as water, dust, debris, and other foreign matter. In some embodiments, display assembly 140 includes a seal 149 that interacts with display assembly 140, such as outer cover 141, and a feature of electronic device housing 110. Seal 149 facilitates a robust sealing engagement between shoulder 117 and/or top wall 161c of connector receptacle 161 and an inner surface of display panel 142. Connector receptacle 161 and shoulder 117 are both part of a unitary electronic device housing 110.

Connector receptacle 161 may extend a greater distance inwards from sidewall 113 than shoulder 117 (e.g., connector receptacle 161 extends a greater distance inwards from sidewall 113 than shoulder 117 extends inwards at locations where connector receptacle 161 is not present). For example, length (l) of connector receptacle 161 is greater than a width ($w_{shoulder}$) (FIG. 4) of shoulder 117. Length (l) of connector receptacle 161 may be more than 2, 3, 4, 5, 6, 7, 8 or more than 8 times the width of should 117 and/or seal 141. Such dimensions may provide an adequate length for connector receptacle 161 to receive a complementary electrical connector and securely maintain the complementary connector in electrical engagement with electrical connector end 162.

In some embodiments, connector receptacle 161 is integrally formed with a lip or flange 118 of electronic device housing 110. Display assembly 140 may be received by lip 118 such that display panel 142 is at least partially nested within electronic device housing 110. A display panel 142 at least partially nested within a portion of electronic device housing 110 can provide an aesthetically pleasing and streamlined appearance, and/or a robust and sealing engagement between display assembly 140 and electronic device housing 110. Connector receptacle 161, and particularly top wall 161c, is positioned below an outermost portion of lip 118 and/or shoulder 117 so that display assembly 140 may be at least partially accommodated above connector receptacle 161.

Connector receptacle 161 may likewise be integrally formed with other features of electronic device housing 110, such as speaker ports, openings that accommodate buttons, switches, or other user inputs, camera mounting features that a camera assembly may engage with, and/or other features of electronic device housing 110. One or more of these features may be integrally formed with electronic device housing 110 as a unitary component together with connector receptacle 161.

Example connector receptacle 161 that is integrally formed with electronic device housing 110 as a unitary component can reduce the thickness of electrical connector 160 and the overall thickness required of electronic device 100. For example, the thickness (T) of electronic device 100 along the z-axis is dependent on components critical to the overall thickness, as shown in the cross-sectional view of FIG. 6. In one example, the thickness of electronic device 100 is dependent in part on the thickness associated with electrical connector 160, including a thickness of (A) top wall 161c integrated with electronic device housing 110, (B) the space 165 of connector receptacle 161 between top and bottom walls 161c, 161d, and (C) the bottom wall 161d integrated with electronic device housing 110. Additional thickness associated with a separate housing for electrical connector 160 is not required because connector receptacle 161 is defined by the electronic device housing 110 itself. Accordingly, the overall thickness of electronic device housing 110 may be reduced (e.g., as compared to an electronic connector having an additional housing defining a connector receptacle). In some embodiments, such as USB-C type connector assemblies, connector receptacle 161 integrated with electronic device housing may reduce the thickness of electrical connector 160 between 0.2 mm and 2 mm, 0.4 mm and 1 mm, or about 0.6 mm compared to some configurations in which connector 160 includes a connector receptacle that is separate from electronic device housing 110.

Connector 160 may include components that facilitate electrical and mechanical connection with other components of electronic device 100. In some embodiments, connector 160 includes circuit board assembly 163 having a connector body 164 and circuit board 169. Connector body 164 may have a geometry that facilitates mechanical connection between connector receptacle 161 and circuit board 169, and electrical connection between electrical connector end 162 and circuit board 169, for example. For example, connector body 164 is sized and configured to be positioned within second opening 167 of connector receptacle 161. Connector body 164 may engage with side walls 161a, 161b, and top and bottom walls 161c, 161d. Connector body 164 may be held in position by frictional engagement with connector receptacle 161.

In some embodiments, connector body 164 is sealingly engaged with connector receptacle 161 such that water, dust, and other foreign contaminants are prevented from entering the space within electronic device housing 110 (e.g., through opening 167). An o-ring gasket 171 may be provided at least partially surrounding connector body 164. O-ring gasket 171 may be formed of a compliant material that is compressed when engaged with connector receptacle 161 and that maintains sealing engagement with connector receptacle 161 when connector body 164 is positioned at least partially within connector receptacle 161. O-ring gasket 171 may provide additional mechanical robustness of connector 160 by increasing frictional engagement between connector receptacle 161 and connector body 164, and/or may provide a seal to prevent ingress of water, dust, or other contaminants into electronic device housing 110.

Alternatively or additionally, connector body 164 may be secured relative to connector receptacle 161 by adhesive, welding, mechanical fasteners, press-fit connectors, snap-fit connectors, and/or other retention features that facilitate a robust mechanical connection between connector body 164 and connector receptacle 161. In some embodiments, mechanical fasteners 172, such as screws or rivets, (FIG. 4) may be positioned through connector body 164 and/or circuit board 169 to fix circuit board assembly 163 in positioned relative to connector receptacle 160 and electronic device housing 110.

Connector body 164 may be electrically and mechanically connected to circuit board 169 to provide a robust connection that can withstand repeated connection with an external electrical connector inserted into connector receptacle 161. In some embodiments, connector body 164 is mounted to circuit board 169 with surface-mount technology (SMT) techniques. In other embodiments, connector body 164 may be joined to circuit board 164 with a through-hole connection, a flex connector, or other connection that provides a reliable electrical connection between connector body 164 and circuit board 169. In some embodiments, circuit board 169 is integrally formed with circuit board 130b (e.g., circuit board 169 is a portion of circuit board 130b). In other embodiments, circuit board 169 may be a circuit board primarily dedicated to electrical connections associated with connector 160 that is electrically connected to one or more other circuit boards of electronic device 100.

Figure 7:
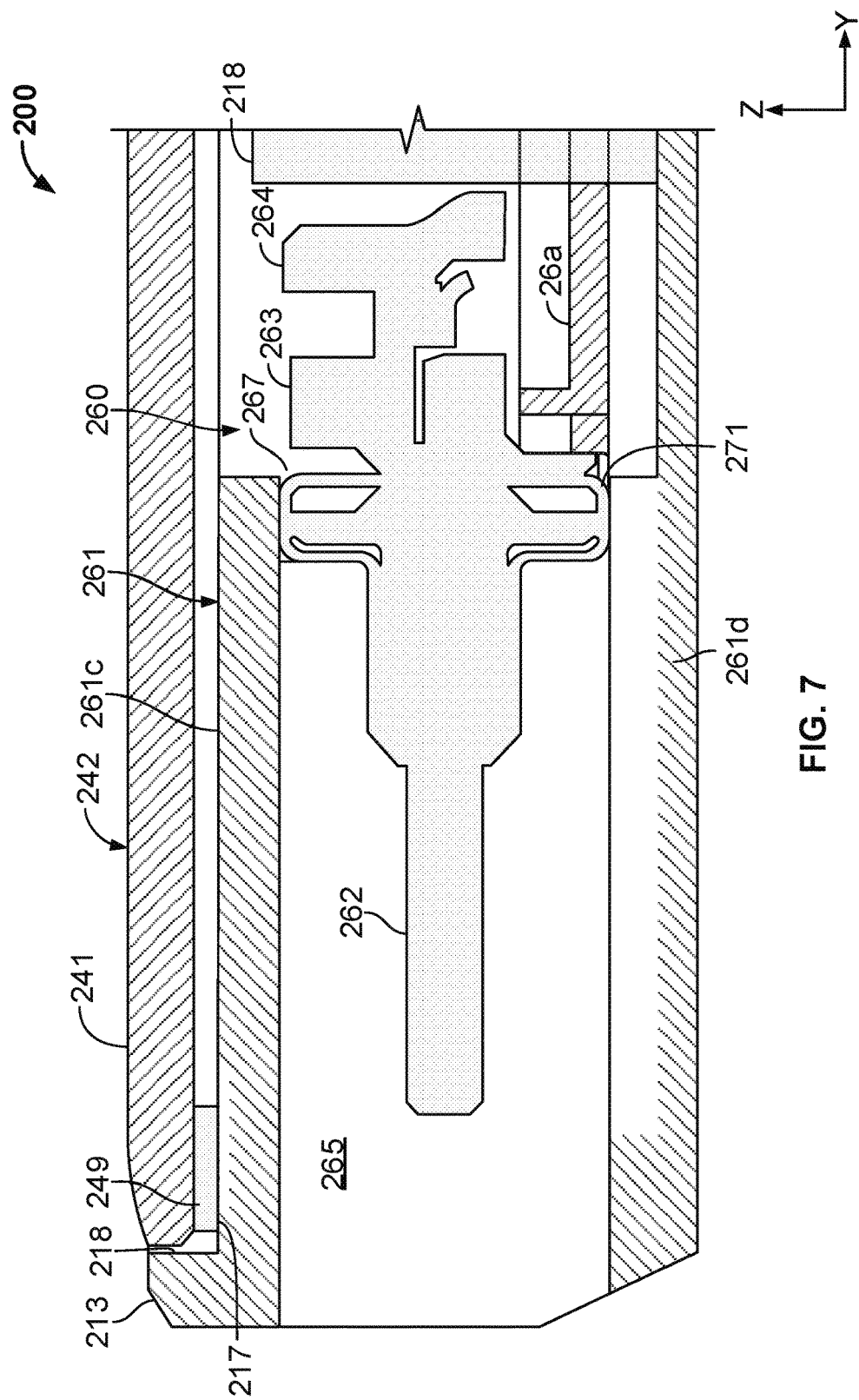
FIG. 7 is another connector receptacle integral with an electronic device housing.

Referring to FIG. 7, another example electronic device 200 is shown, including connector 260 having a connector receptacle 261 integrally formed with electronic device housing 210. In various embodiments, electronic device 200 and connector 260 may have features similar to electronic device 100 and connector receptacle 160 described herein. Electrical connector 260 includes male electrical connector 262, connector body 264, and circuit board 265.

Connector 260 includes one or more mechanical features integral with electronic device housing 210 that provide a robust structure that can be used through thousands of cycles without failure. For example, electronic device housing 210 may include one or more posts 218 extending from back major planar face 215 that connector body 264 and/or circuit board 265 may abut against. Excessive force on connector body 264 may thus be absorbed by posts 218 and electronic device housing 210 (e.g., instead of on electrical connections between connector body 264 and circuit board 269).

Posts 218 may be positioned to provide a robust connector 260 while facilitating assembly and manufacture of electronic device 200. In some embodiments, posts 218 may be offset from opening 267 of connector receptacle 261 such that male connector end 262 and connector body 264 may be inserted into connector receptacle 261 through opening 267 from within electronic device housing 210. In such a configuration, a central, longitudinal axis of connector receptacle 261 does not intersect posts 218. In other embodiments, posts 218 may be positioned at least partially aligned with opening 267. Male connector end 262 and connector body 264 may be inserted into connector receptacle 261 through opening 266 and subsequently attached with circuit board 269, for example.

Figure 8:
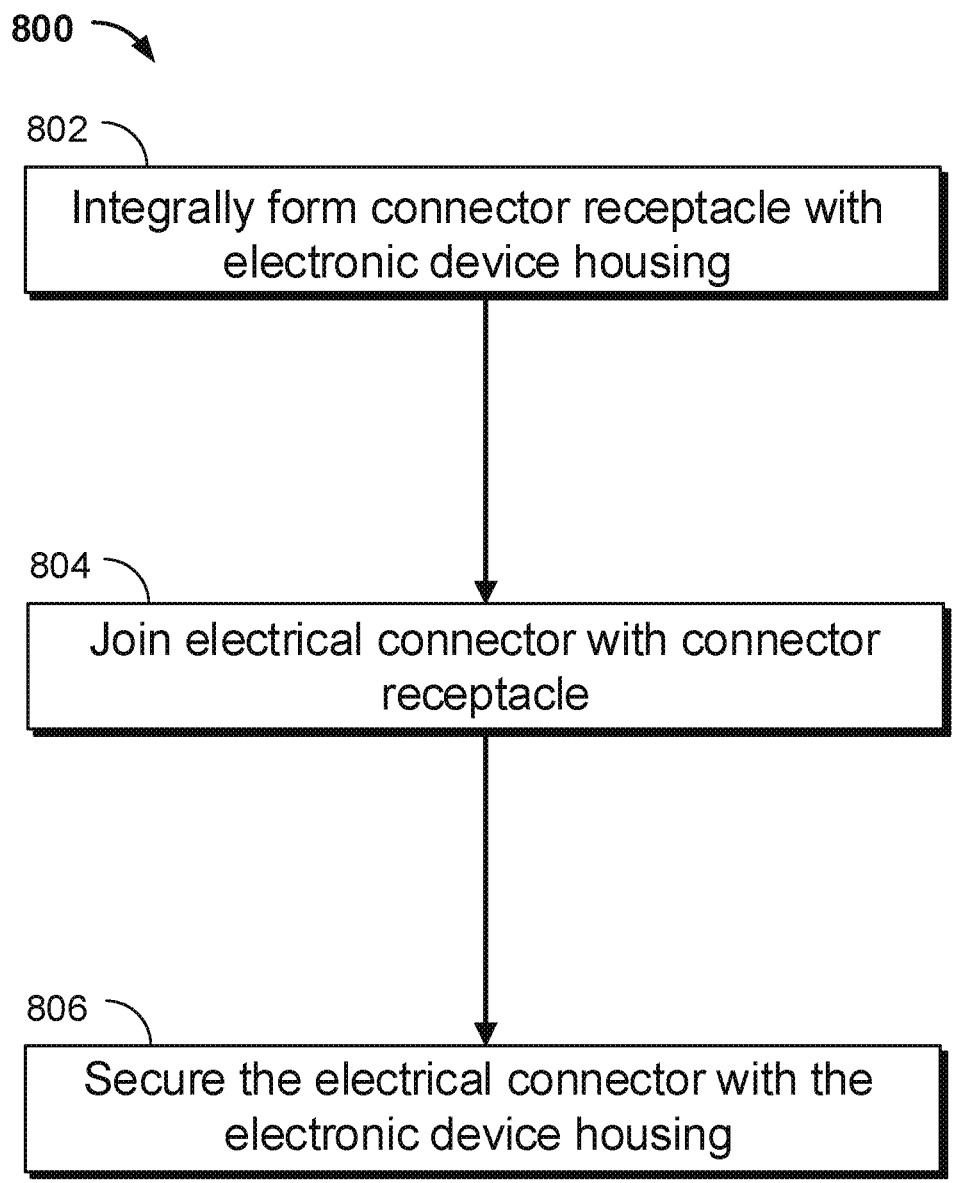
FIG. 8 is flow diagram of a method of manufacturing an electronic device.

Example connector receptacle 161 integrally formed with electronic device housing 110 facilitates efficient and reliable manufacturing techniques. Referring to FIG. 8, a flow diagram of an example process 800 for manufacturing an electronic device, such as electronic device 100, 200 is shown. Process 800 includes operation 802 of integrally forming a connector receptacle in an electronic device housing. The electronic device housing, such as electronic device housing 110, can formed by milling, molding, forging, printing, etching, and/or other manufacturing techniques, such that electronic device housing includes an integrally formed connector receptacle. In some embodiments, the connector receptacle defines first and second openings at its end separated by walls in the shape of an oval tube.

In some embodiments, the connector receptacle and electronic device housing are formed from the same material and/or at the same time (e.g., in the same milling, molding, etc., operation). For example, the connector receptacle is integrally formed with the electronic device housing and not a separately formed component that is later welded, glued, snapped, or fastened together.

Process 800 further includes operation 804 of joining a connector body with the connector receptacle of the electronic device housing. In some embodiments, connector body may be inserted from an exterior opening in a side wall of the electronic device housing (e.g., such as through first opening 166 defined through side wall 113). The connector body may frictionally engage inner surfaces of connector receptacle to provide a robust mechanical connection. After the connector body has been inserted within the connector receptacle, the connector body may be connected with a circuit board (e.g., printed circuit board, flexible printed circuit, etc.), to facilitate connection with other electronic components of the electronic device.

Alternatively, operation 804 of joining a connector body with the connector receptacle may include inserting the connector body into the connector receptacle from an interior opening of the connector receptacle within the electronic device housing (e.g., through second opening 167 of connector receptacle 161). Inserting the connector body through an interior opening may facilitate efficient assembly by allowing the connector body and other components of the associated circuit board assembly to be joined prior to assembly with the electronic device housing.

In some embodiments, process 800 includes one or more operations 806 of securing the connector body, circuit board, and/or other components of the circuit board assembly with the electronic device housing. For example, operation 806 includes securing the circuit board to electronic device housing with one or more screws, snap-fits, welds, adhesives, or other connection to secure the circuit board in place through repeated insertion and removal cycles of a complementary connector with the connector receptacle. In some embodiments, the circuit board is positioned and secured relative to one or more retention features integrally formed with the electronic device housing, such as one or more posts, tabs, flanges, grooves or other retention features. The circuit board may have one or more complementary retention features, such as complementary posts, tabs, flanges, grooves, or other complementary retention features that facilitate a robust connection between the circuit board and electronic device housing.

While this specification contains many specific implementation details, these should not be construed as limitations on the scope of the disclosed technology or of what may be claimed, but rather as descriptions of features that may be specific to particular embodiments of particular disclosed technologies. Certain features that are described in this specification in the context of separate embodiments can also be implemented in combination in a single embodiment in part or in whole. Conversely, various features that are described in the context of a single embodiment can also be implemented in multiple embodiments separately or in any suitable subcombination. Moreover, although features may be described herein as acting in certain combinations and/or initially claimed as such, one or more features from a claimed combination can in some cases be excised from the combination, and the claimed combination may be directed to a subcombination or variation of a subcombination. Similarly, while operations may be described in a particular order, this should not be understood as requiring that such operations be performed in the particular order or in sequential order, or that all operations be performed, to achieve desirable results. Particular embodiments of the subject matter have been described. Other embodiments are within the scope of the following claims.

What is claimed is:

1. An electronic device, comprising:
an electronic device housing having a back major wall and a sidewall oriented perpendicular to the back major wall, the back major wall and the sidewall integral to the electronic device housing, the electronic device housing including a shoulder;
a display assembly engaged with the shoulder;
a connector receptacle integral to the electronic device housing, the connector receptacle including a bottom wall and a top wall, the connector receptacle having a height between the top wall and the bottom wall, the bottom wall and the top wall extending between a first opening through an outer surface of the sidewall of the electronic device housing and a second opening within the electronic device housing, the bottom wall of the connector receptacle defined by the back major wall of the electronic device housing, the connector receptacle being a unitary component with the back major wall and with the sidewall of the electronic device housing and being made of a same material as the back major wall and the sidewall of the electronic device housing;
an electrical connector positioned at least partially within the connector receptacle, the electrical connector including an electrical connector end at least partially within the connector receptacle and a connector body that occupies all of the height of the connector receptacle within the connector receptacle;
a first circuit board positioned at a bottom of the electronic device housing, the connector body connected to the first circuit board; and
a post that extends from the back major wall of the electronic device housing, the connector receptacle positioned between the sidewall and the post.

2. The electronic device of claim 1, wherein the connector receptacle includes side walls extending between the first opening through the outer surface of the sidewall and the second opening within the electronic device housing.

3. The electronic device of claim 2, wherein the connector receptacle has a length between the first and second openings, and the length is greater than a thickness of the sidewall.

4. The electronic device of claim 3, wherein the connector receptacle has a width between opposite side walls of the connector receptacle, and the length is greater than the width.

5. The electronic device of claim 1, wherein the electrical connector is a USB-C type connector.

6. The electronic device of claim 1, wherein the electronic device housing includes a top major wall that opposes the back major wall of the electronic device housing, the top major wall of the electronic device housing being located closer to a camera of the electronic device than to the back major wall of the electronic device housing.

7. The electronic device of claim 1, further comprising:
a second circuit board positioned at a top of the electronic device housing; and
the connector body directly connected to the first circuit board.

8. The electronic device of claim 7, wherein a microphone and a vibrator are mounted to the second circuit board.

9. The electronic device of claim 1, wherein the connector receptacle is integral with the shoulder of the electronic device housing.

10. The electronic device of claim 9, wherein the shoulder has a width and the connector receptacle has a length, and the length is greater than the width of the shoulder.

11. The electronic device of claim 1, wherein the electrical connector end is a male electrical connector end.

12. The electronic device of claim 1, wherein the post is integral to the electronic device housing.

13. The electronic device of claim 1, further comprising a circuit board positioned at a bottom of the electronic device housing,
wherein the connector body is directly connected to the circuit board,
wherein the circuit board comprises a cut-out region along the sidewall of the electronic device housing, and
wherein the connector receptacle is at least partially nested within the cut-out region.

14. The electronic device of claim 1, wherein the first and second openings are a same size.

15. The electronic device of claim 14, wherein the connector body is frictionally engaged with the top wall, bottom wall, and side walls of the connector receptacle.

16. An electronic device, comprising:
an electronic device housing having a back major wall and a sidewall oriented perpendicular to the back major wall, the back major wall and the sidewall integral to the electronic device housing, the electronic device housing including a shoulder;
a display assembly engaged with the shoulder;
a first circuit board positioned at a top of the electronic device housing;
a second circuit board positioned at a bottom of the electronic device housing;
a connector receptacle integral to the electronic device housing, the connector receptacle including a bottom wall and a top wall and a height between the top wall and the bottom wall, the bottom wall and the top wall extending between a first opening through an outer surface of the sidewall of the electronic device housing and a second opening within the electronic device housing, the bottom wall of the connector receptacle defined by the back major wall of the electronic device housing, the connector receptacle being a unitary component with the back major wall and with the sidewall of the electronic device housing and being made of a same material as the back major wall and the sidewall of the electronic device housing; and
an electrical connector fixedly positioned at least partially within the connector receptacle, the electrical connector including a male electrical connector end at least partially within the connector receptacle and a connector body directly connected to the second circuit board and that occupies all of the height of the connector receptacle within the connector receptacle;
a first circuit board positioned at a bottom of the electronic device housing, the connector body connected to the first circuit board; and
a post that extends from the back major wall of the electronic device housing, the connector receptacle positioned between the sidewall and the post.

17. The electronic device of claim 16, wherein the connector receptacle has a length between the first and second openings, and the length is greater than a thickness of the sidewall.

18. The electronic device of claim 17, wherein the connector receptacle has a width between opposite side walls of the connector receptacle, and the length is greater than the width.

* * * * *